United States Patent
Chang et al.

(10) Patent No.: US 10,770,144 B1
(45) Date of Patent: Sep. 8, 2020

(54) NON-VOLATILE MEMORY AND PROGRAM METHOD THEREOF

(71) Applicant: MACRONIX International Co., Ltd., Hsinchu (TW)

(72) Inventors: Hsing-Wen Chang, Miaoli County (TW); Yao-Wen Chang, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/277,877

(22) Filed: Feb. 15, 2019

(51) Int. Cl.
  *G11C 16/10* (2006.01)
  *G11C 16/24* (2006.01)
  *G11C 16/08* (2006.01)
  *H01L 27/115* (2017.01)

(52) U.S. Cl.
  CPC .............. *G11C 16/10* (2013.01); *G11C 16/08* (2013.01); *G11C 16/24* (2013.01); *H01L 27/115* (2013.01)

(58) Field of Classification Search
  CPC .......... G11C 16/10; G11C 16/08; G11C 16/24
  USPC ..................................................... 365/185.18
  See application file for complete search history.

(56) References Cited

U.S. PATENT DOCUMENTS

| | | | |
|---|---|---|---|
| 9,741,438 B2 * | 8/2017 | Kwak | G11C 16/10 |
| 2013/0250688 A1 | 9/2013 | Chen et al. | |
| 2016/0099068 A1 * | 4/2016 | Kwak | G11C 16/10 365/185.02 |

OTHER PUBLICATIONS

"Office Action of Taiwan Counterpart Application," dated Sep. 3, 2019, p. 1-p. 10.

* cited by examiner

*Primary Examiner* — Xiaochun L Chen
(74) *Attorney, Agent, or Firm* — J.C. Patents

(57) ABSTRACT

A non-volatile memory and a program method thereof are provided. The program method includes: setting one of a plurality of word lines to be a program word line, setting the word lines except the program word line to be a plurality of unselected word lines; raise a voltage on the program word line from a reference voltage to a first program voltage during a first sub-time period of a program time period; raising the voltage on the program word line from the first program voltage to a second program voltage during a second sub-time period of the program time period; and raising voltages on at least part of the unselected word lines from the reference voltage to a pass voltage during the second sub-time period.

20 Claims, 7 Drawing Sheets

NON-VOLATILE MEMORY AND PROGRAM METHOD THEREOF

BACKGROUND

Technical Field

The invention relates to a non-volatile memory and a program method thereof. More particularly, the invention relates to a non-volatile memory and a program method thereof capable of speeding up programming.

Description of Related Art

With an advancement of electronic technologies, electronic products have become important tools in our daily lives. Accordingly, capacity of memory devices in electronic products increases and demand for better accessing efficiency is on the rise as well so as to provide more functions and transmit more information.

Taking a non-volatile memory for example, as demand for increased capacity rises, the chip layout density of the non-volatile memory increases, too. As such, when data of a memory cell is accessed, voltage adjustment of the word lines is considerably influenced by the parasitic capacitance among the word lines. In particularly, when programming is performed and especially when a non-volatile memory cell is to be programmed, the voltage on the program word line is required to be increased to a sufficiently high voltage value most of the time to complete programming. In the prior art, the voltage on the program word line is often influenced by the parasitic capacitance among the word lines, so that the speed of raising the voltage is lowered. As such, the speed of programming is reduced, and operating efficiency of the non-volatile memory is thereby influenced.

SUMMARY

The invention provides a non-volatile memory and a program method thereof capable of effectively reducing time required for programming.

A program method of a non-volatile memory provided by an embodiment of the invention includes the following steps. One of a plurality of word lines is set to be a program word line and the word lines except the program word line are set to be a plurality of unselected word lines. A voltage on the program word line is raised from a reference voltage to a first program voltage during a first sub-time period of a program time period. The voltage on the program word line is raised from the first program voltage to a second program voltage during a second sub-time period of the program time period. The second program voltage is greater than the first program voltage. Moreover, the voltages on at least part of the unselected word lines are raised from the reference voltage to a pass voltage during the second sub-time period. The first sub-time period is before the second sub-time period.

A non-volatile memory provided by an embodiment of the invention includes a plurality of word lines, a plurality of word line drivers, and a controller. Each of the word lines is coupled to at least one memory cell string. The word line drivers are coupled to the word lines and are configured to adjust voltages on the word lines. The controller is coupled to the word line drivers and is configured to: set one of the word lines to be a program word line and the word lines except the program word line to be a plurality of unselected word lines; raise a voltage on the program word line from a reference voltage to a first program voltage during a first sub-time period of a program time period; raise the voltage on the program word line from the first program voltage to a second program voltage during a second sub-time period of the program time period, where the second program voltage is greater than the first program voltage; and raise the voltages on at least part of the unselected word lines from the reference voltage to a pass voltage during the second sub-time period. The first sub-time period is before the second sub-time period.

To sum up, in the program time period of the invention, when the voltage on the program word line is raised to the sufficiently great enough second program voltage, the voltages on at least part of the unselected word lines are synchronously raised to the pass voltage. In this way, the influences caused by the parasitic capacitance among the unselected word lines and the program word line may be effectively reduced, the voltage on the program word line may be idly raised to the sufficiently great enough voltage value, and the memory cell may be programmed more rapidly.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
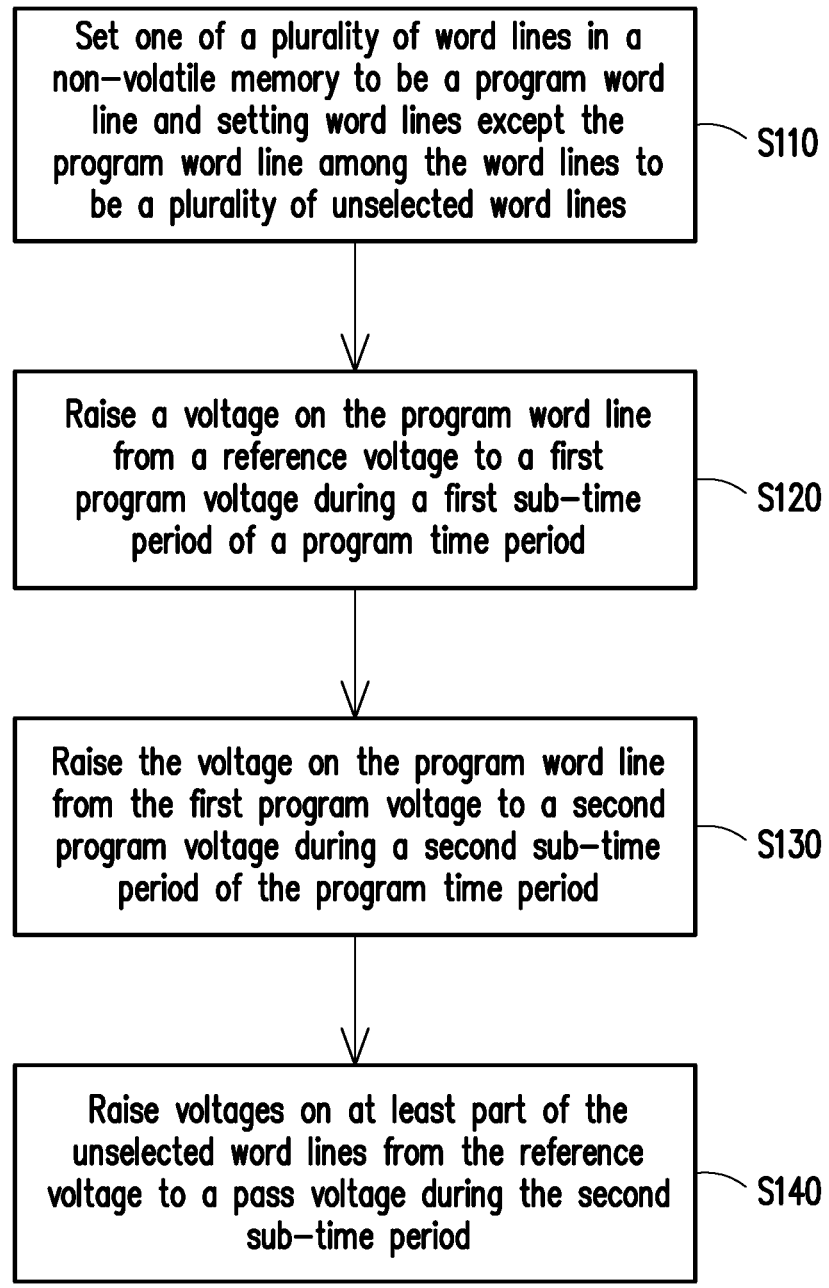
FIG. 1 is a flow chart illustrating a program method of a non-volatile memory according to an embodiment of the invention.

With reference to FIG. 1, FIG. 1 is a flow chart illustrating a program method of a non-volatile memory according to an embodiment of the invention. In FIG. 1, when a non-volatile memory is to be programmed, one of a plurality of word lines in the non-volatile memory is set to be a program word line and the word lines except the program word line among the word lines are set to be a plurality of unselected word lines in step S110. Next, in step S120, during a first sub-time period of a program time period, a voltage on the program word line is raised from a reference voltage to a first program voltage. Next in step S130, during a second sub-time period of the program time period, the voltage on the program word line is raised from the first program voltage to a second program voltage, where the second program voltage is greater than the first program voltage. Note that the second sub-time period of step S130 is after the first sub-time period of step S120, and the first sub-time period and the second sub-time period do not overlap. In addition, in step S140, during the second sub-time period, voltages on at least part of the unselected word lines are raised from the reference voltage to a pass voltage.

Note that in the embodiments of the invention, the voltage on the program word line and the voltages on at least part of the unselected word lines are pulled up simultaneously in the second sub-time period. In this way, influences brought by parasitic capacitance among the program word line and the other unselected word lines on the voltage on the program word line when being raised may be effectively reduced, so that the voltage on the program word line is raised to the second program voltage more rapidly. Further, a memory cell can be programmed more rapidly as well.

Note that the movement of raising the voltage on the program word line from the first program voltage to the second program voltage in step S130 and the movement of raising the voltages on at least part of the unselected word lines from the reference voltage to the pass voltage in step S140 can be synchronized. Further, voltages on two end points of each parasitic capacitance among the program word line and the other unselected word lines are synchronously raised, so that influences caused by the parasitic capacitance are reduced.

Figure 2A:
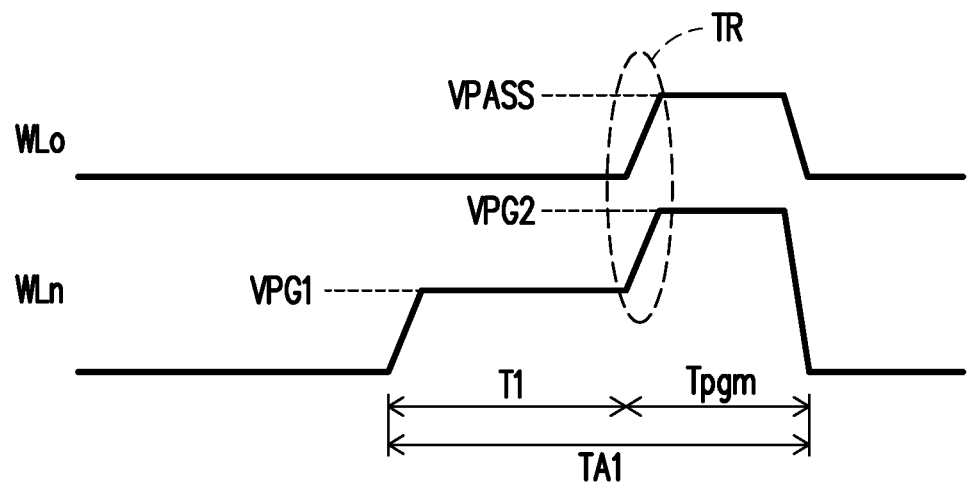
FIG. 2A to FIG. 2C are waveform diagrams illustrating movements in a program method of a non-volatile memory according to different embodiments of the invention.

With reference to FIG. 1 and FIG. 2A to FIG. 2C, FIG. 2A to FIG. 2C are waveform diagrams illustrating movements in a program method of a non-volatile memory according to different embodiments of the invention. In FIG. 2A, during a first sub-time period T1 of a program time period TA1, a voltage on a program word line WLn is raised from a reference voltage (e.g., a reference ground voltage) to a first program voltage VPG1 and is maintained at the first program voltage VPG1. In contrast, a voltage on an unselected word line WLo is maintained at the reference voltage in the first sub-time period T1 of the program time period TA1. Next, during a second sub-time period Tpgm of the program time period TA1, the voltage on the program word line WLn is raised from the first program voltage VPG1 to a second program voltage VPG2. Correspondingly, during the second sub-time period Tpgm of the program time period TA1, the voltage on the unselected word line WLo is synchronously raised from the reference voltage to a pass voltage VPASS.

Note that during the second sub-time period Tpgm, the movement of raising the voltage on the program word line WLn and the movement of raising the voltage on the unselected word line WLo are synchronously performed in a transition time period TR. In this way, influences brought by parasitic capacitance between the program word line WLn and the unselected word line WLo are reduced.

In addition, when the voltage on the program word line WLn is raised to the second program voltage VPG2, programming of a connected memory cell string on the program word line WLn may be executed and completed during the second sub-time period Tpgm. Therefore, on the premise that the voltage on the program word line WLn may be rapidly raised to the second program voltage VPG2, programming of the memory cell string can be rapidly completed as well.

In this embodiment, a voltage value of the pass voltage VPASS is less than a voltage value of the second program voltage VPG2. In some embodiments of the invention, the voltage value of the pass voltage VPASS may be configured to be substantially equal to a difference value between the voltage value of the second program voltage VPG2 and a voltage value of the first program voltage VPG1.

Incidentally, in FIG. 2A, all word lines except the program word line WLn may all be set to be the unselected word lines WLo to move in accordance with the waveforms in FIG. 2A.

Figure 2B:
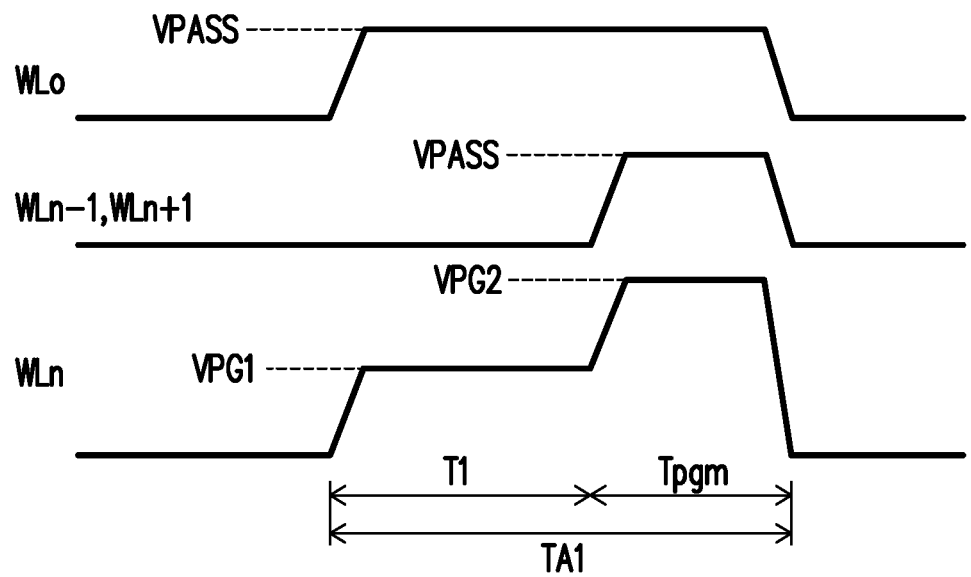

In FIG. 2B, the word lines except the program word line WLn are divided into the adjacent unselected word lines WLn+1 and WLn−1 adjacent to the program word line WLn and other unselected word line WLo. In terms details of the movement, during the first sub-time period T1 of the program time period TA1, the voltage on the program word line WLn is raised from the reference voltage to the first program voltage VPG1 and is maintained at the first program voltage VPG1. In contrast, during the first sub-time period T1 of the program time period TA1, the voltage on the unselected word line WLo is raised from the reference voltage to the pass voltage VPASS. Here, the movement of raising the voltage on the unselected word line WLo and the movement of raising the voltage on the program word line WLn can be synchronized. Next, during the second sub-time period Tpgm of the program time period TA1, the voltage on the program word line WLn is raised from the first program voltage VPG1 to the second program voltage VPG2. Correspondingly, during the second sub-time period Tpgm of the program time period TA1, the voltages on the adjacent unselected word lines WLn+1 and WLn−1 are synchronously raised from the reference voltage to the pass voltage VPASS.

In this embodiment, based on parasitic capacitance among the adjacent unselected word lines WLn+1 and WLn−1 and the program word line WLn, a greater parasitic effect is provided to the program word line WLn. Therefore, when voltages on the adjacent unselected word lines WLn+1 and WLn−1 and the voltage on the program word line WLn are synchronously raised during the second sub-time period Tpgm of the program time period TA1, the effect generated by the parasitic capacitance may be effectively reduced.

Figure 2C:
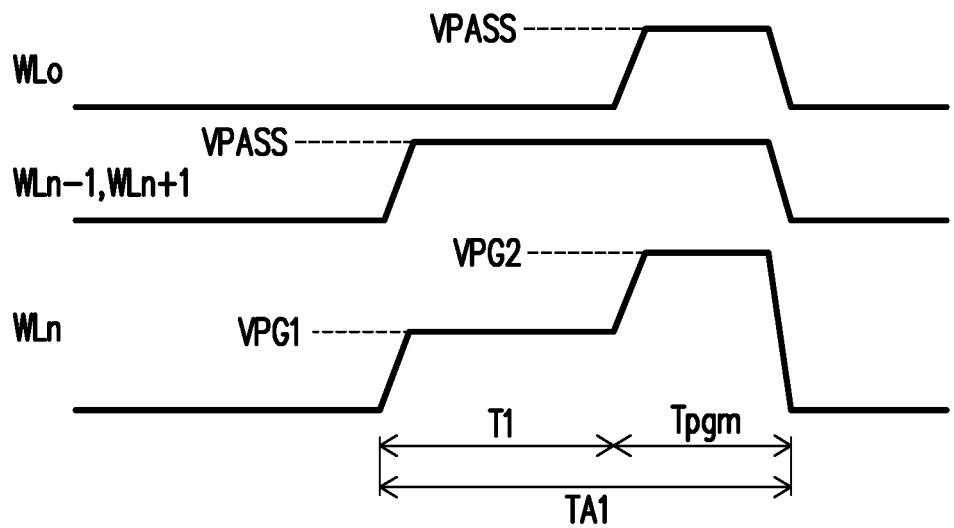

In FIG. 2C, the word lines except the program word line WLn are similarly divided into the adjacent unselected word lines WLn+1 and WLn−1 adjacent to the program word line WLn and other unselected word line WLo. In terms details of the movement, during the first sub-time period T1 of the program time period TA1, the voltage on the program word line WLn is raised from the reference voltage to the first program voltage VPG1 and is maintained at the first program voltage VPG1. In contrast, during the first sub-time period T1 of the program time period TA1, the voltages on the adjacent unselected word lines WLn+1 and WLn−1 are raised from the reference voltage to the pass voltage VPASS. Herein, the movement of raising the voltages on the adjacent unselected word lines WLn+1 and WLn−1 and the movement of raising the voltage on the program word line WLn can be synchronized. Next, during the second sub-time period Tpgm of the program time period TA1, the voltage on the program word line WLn is raised from the first program voltage VPG1 to the second program voltage VPG2. Correspondingly, during the second sub-time period Tpgm of the program time period TA1, the voltage on the other unselected word line WLo is synchronously raised from the reference voltage to the pass voltage VPASS.

Figure 2D:
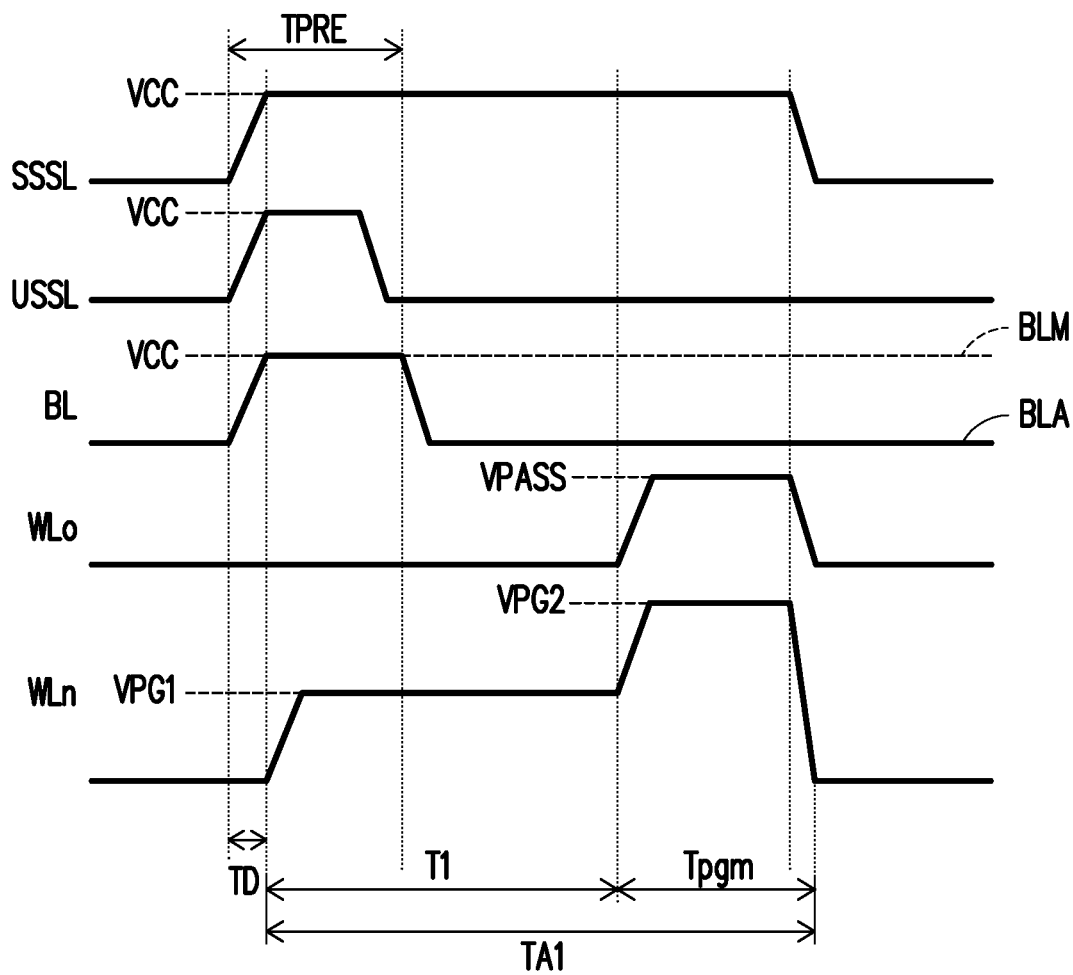
FIG. 2D is a waveform diagram illustrating movement in the program method of the non-volatile memory according to another embodiment of the invention.

With reference to FIG. 2D as follows, FIG. 2D is a waveform diagram illustrating movement in the program method of the non-volatile memory according to another embodiment of the invention. In FIG. 2D, a pre-charge time period TPRE is set before the program time period TA1. During the pre-charge time period TPRE, voltages on a plurality of source lines SSSL and USSL corresponding to the word lines WLo and WLn and a voltage on a bit line BL are raised from the reference voltage to a pre-charge voltage VCC. Further, after the pre-charge time period TPRE begins, the program time period TA1 can be activated after a delay time TD.

From another perspective, during the pre-charge time period TPRE, the voltages on the source lines SSSL and USSL and the voltage on the bit line BL can be synchronously raised to the pre-charge voltage VCC. Herein, the source line SSSL is a selected source line (corresponding to a memory cell which is selected to be programmed), and the source line USSL is an unselected source line (corresponding to a memory cell which is not selected to be programmed). During the pre-charge time period TPRE, the voltage on the source line SSSL may be maintained to be equal to the pre-charge voltage VCC, and the voltage on the source line USSL is pulled down to the reference voltage before the pre-charge time period TPRE ends. The voltage on the bit line BL is maintained to be equal to the pre-charge voltage VCC during the pre-charge time period TPRE.

Incidentally, in this embodiment, the bit line BL may be a mask bit line BLMA or a program bit line BLA. The mask bit line BLMA corresponds to a memory cell which is masked but is not to be programmed, while the program bit line BLA corresponds to a memory cell which is to be programmed.

Next, after the pre-charge time period TPRE ends, during the first sub-time period T1 of the program time period TA1, the voltage on the mask bit line BLMA is maintained to be equal to the pre-charge voltage VCC, and the voltage on the program bit line BLA is pulled down to be the reference voltage. Besides, the voltage on the source line SSSL may be maintained to be equal to the pre-charge voltage VCC. Further, during the first sub-time period T1 of the program time period TA1, the voltage on the program word line WLn is raised from the reference voltage to the first program voltage VPG1.

In the second sub-time period Tpgm of the program time period TA1, the voltages on the program word line WLn and the unselected word line WLo are synchronously raised. Herein, the voltage on the unselected word line WLo is raised from the reference voltage to the pass voltage VPASS, and the voltage on the program word line WLn is raised from the first program voltage VPG1 to the second program voltage VPG2.

In this embodiment, the manner used to adjust the voltages on the program word line WLn and the unselected word line WLo illustrated in FIG. 2D is similar to that illustrated in FIG. 2A. In other embodiments of the invention, the manner used to adjust the voltages in FIG. 2B and FIG. 2C may also be applied to the embodiment of FIG. 2D.

Figure 3:
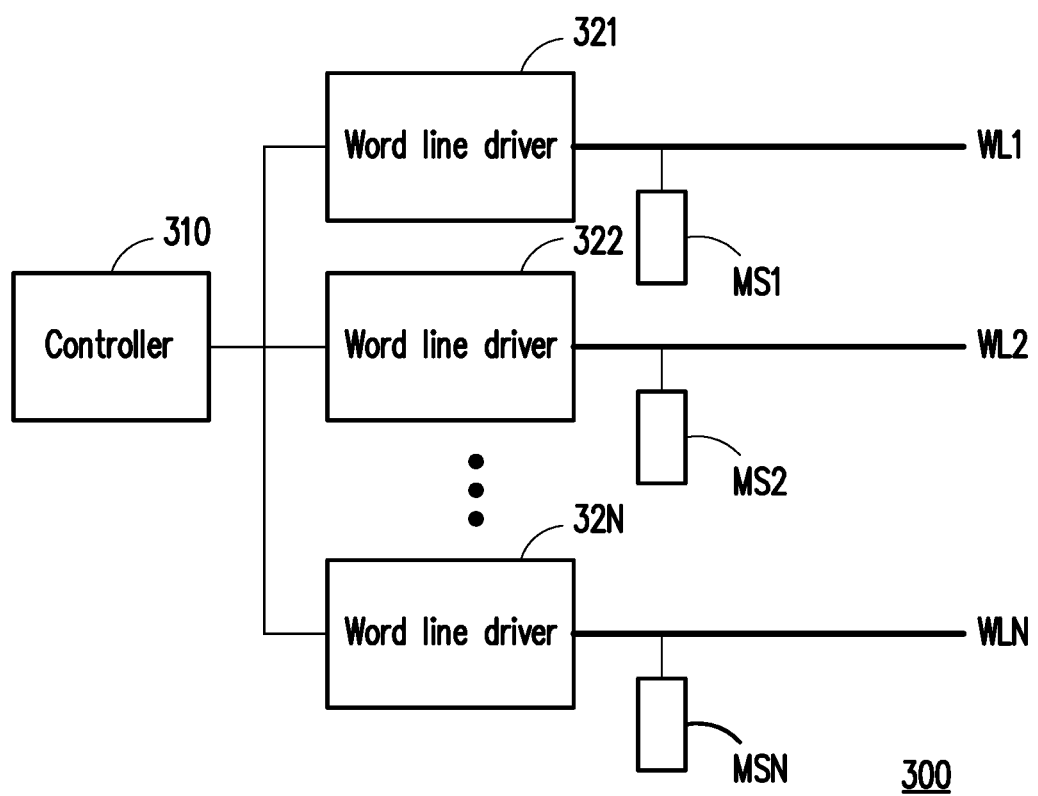
FIG. 3 is a schematic diagram illustrating a non-volatile memory according to an embodiment of the invention.

With reference to FIG. 3, FIG. 3 is a schematic diagram illustrating a non-volatile memory according to an embodiment of the invention. A non-volatile memory 300 includes a controller 310, a plurality of word line drivers 321 to 32N, and a plurality of word lines WL1 to WLN. The word lines WL1 to WLN are respectively coupled to one or a plurality of memory cell strings MS1 to MSN, and the word line drivers 321 to 32N are respectively coupled to the word lines WL1 to WLN. The word line drivers 321 to 32N are respectively configured to adjust voltages on the word lines WL1 to WLN.

The controller 310 is coupled to the word line drivers 321 and 32N and is configured to control the word line drivers 321 to 32N to respectively adjust the voltages on the word lines WL1 to WLN. In this embodiment, the controller 310 may control the word line drivers 321 to 32N according to the waveforms in FIG. 2A to FIG. 2D and programs the memory cell strings MS1 to MSN.

In this embodiment, the controller 310 may be a processor featuring computing capability. Alternatively, the controller 310 may be designed through hardware description language (HDL) or may be designed in any digital circuit manner known to people having ordinary skill in the art and may be a hardware circuit implemented through a field programmable gate array (FPGA), a complex programmable logic device (CPLD), or an application-specific integrated circuit (ASIC), which is not particularly limited.

Figure 4:
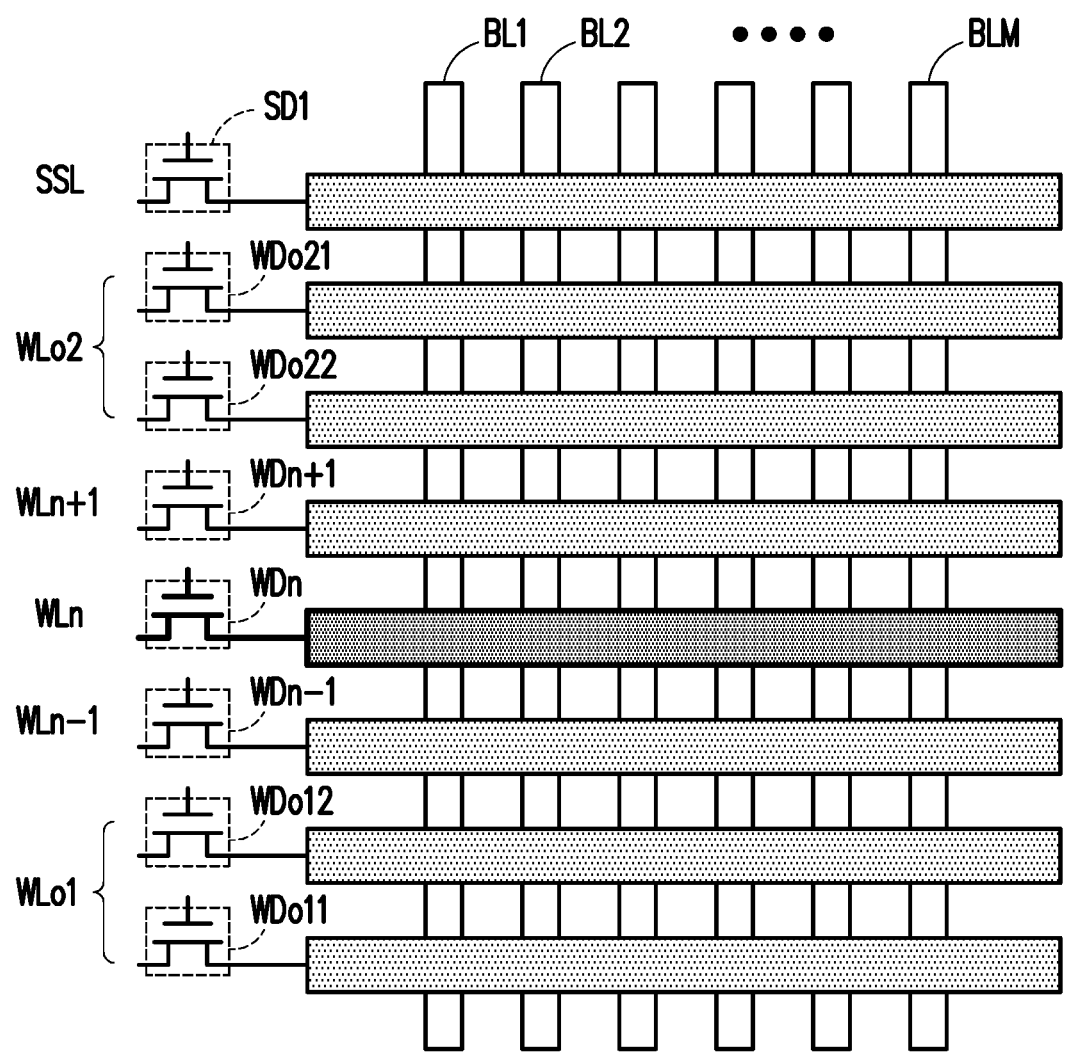
FIG. 4 and FIG. 5 are schematic diagrams illustrating different implementation architectures of non-volatile memories according to an embodiment of the invention.
Figure 5:
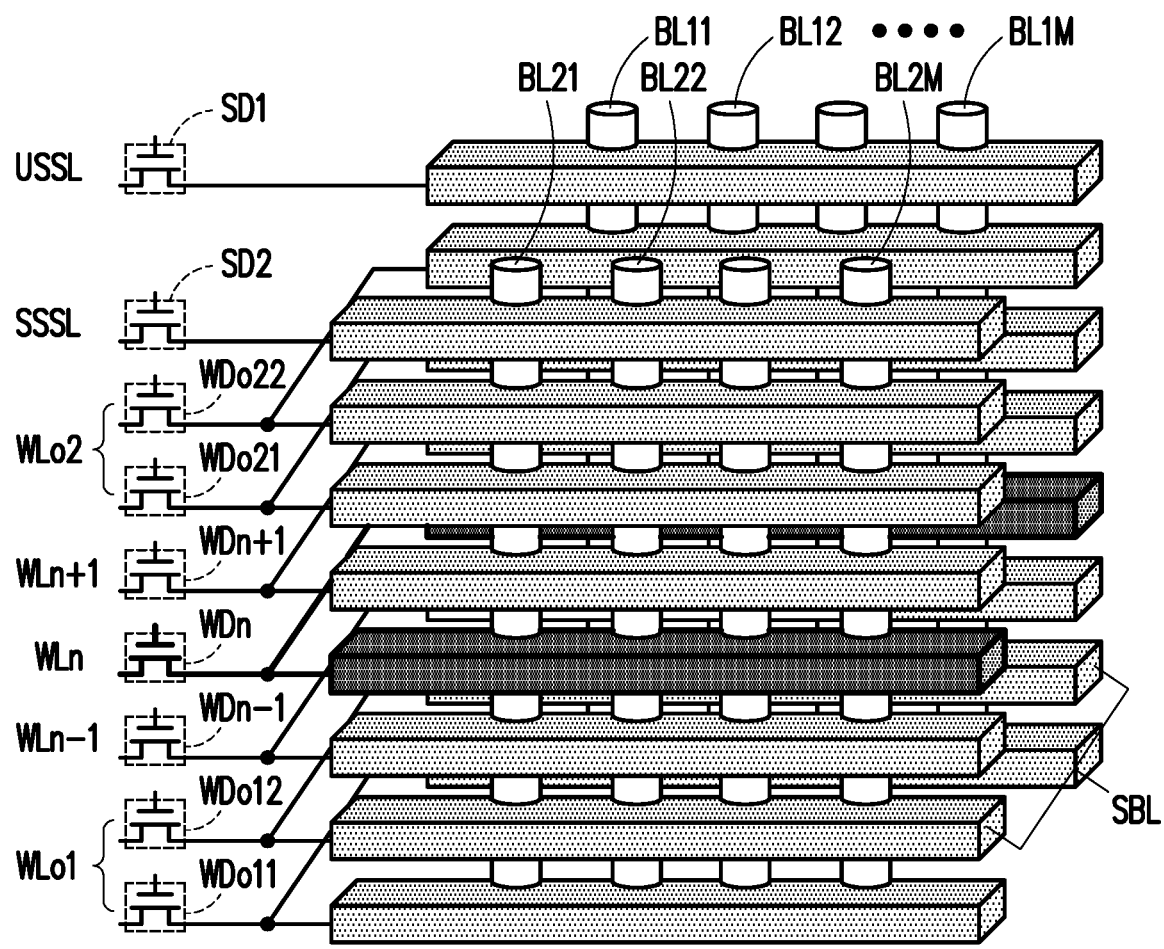

Note that the non-volatile memory provided by the embodiments of the invention may be a two-dimensionally structured flash memory or a three-dimensionally structured flash memory. With reference to FIG. 4 and FIG. 5, FIG. 4 and FIG. 5 are schematic diagrams illustrating different implementation architectures of non-volatile memories according to an embodiment of the invention.

In FIG. 4, a non-volatile memory 400 is a two-dimensionally structured flash memory. The non-volatile memory 400 has a plurality of word line drivers WDo11, WDo12, WDn−1, WDn, WDn+1, WDo22, and WDo21 built by transistors and a source line driver SD1. The word line drivers WDo11 and WDo12 are configured to drive an other unselected word line WLo1, the word line drivers WDo21 and WDo22 are configured to drive an other unselected word line WLo2, the word line drivers WDn−1 and WDn+1 are configured to respectively drive adjacent unselected word lines Wn−1 and Wn+1, and the word line driver WDn is configured to drive a program word line WLn. In addition, the source line driver SD1 is configured to drive the source line SSL. In addition, the non-volatile memory 400 has a plurality of bit lines BL1 to BLM. In FIG. 4, non-volatile memory cells may be disposed on positions at which the bit lines BL1 to BLM and the word lines WLo1, WLo2, WLn−1, WLn, and WLn+1 are alternatively disposed.

In FIG. 5, a non-volatile memory 500 is a three-dimensionally structured flash memory. The non-volatile memory 500 has a plurality of word line drivers WDo11, WDo12, WDn−1, WDn, WDn+1, WDo22, and WDo21 built by transistors and source line drivers SD1 and SD2. The word line drivers WDo11 and WDo12 are configured to drive an other unselected word line WLo1, the word line drivers WDo21 and WDo22 are configured to drive an other unselected word line WLo2, the word line drivers WDn−1 and WDn+1 are configured to respectively drive adjacent unselected word lines Wn−1 and Wn+1, and the word line driver WDn is configured to drive a program word line WLn. In addition, the source line drivers SD1 and SD2 are configured to respectively drive an unselected source line USSL and a selected bit line SSSL. In addition, the non-volatile memory 500 has a plurality of bit lines BL11 to BL1M and BL21 to BL2M. In FIG. 5, non-volatile memory cells may be disposed on positions at which the bit lines BL11 to BL1M and BL21 to BL2M and the word lines WLo1, WLo2, WLn−1, WLn, and WLn+1 are alternatively disposed.

In this embodiment, one word line driver may be configured to drive the same word line commonly used by a plurality of different sub-blocks. Taking the word line driver WDo12 for example, the word line driver WDo12 may be configured to drive the other unselected word line WLo1. Herein, the other unselected word line WLo1 is commonly used by two sub-blocks SBL.

In this embodiment, based on a three-dimension structure, the word lines WLo1, WLo2, WLn−1, WLn, and WLn+1 may individually be disposed according to different height levels. Each of the word lines WLo1, WLo2, WLn−1, WLn, and WLn+1 extends in a horizontal direction. The bit lines BL11 to BL1M and BL21 to BL2M and the word lines WLo1, WLo2, WLn−1, WLn, and WLn+1 may be disposed to be orthogonal to each other.

Figure 6:
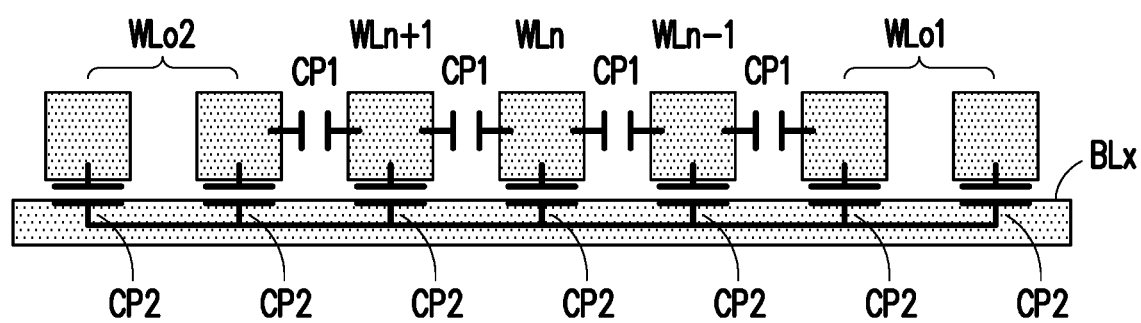
FIG. 6 is a schematic diagram illustrating parasitic capacitance among bit lines according to an embodiment of the invention.

With reference to FIG. 6, FIG. 6 is a schematic diagram illustrating parasitic capacitance among bit lines according to an embodiment of the invention. Based on the illustration of FIG. 6, parasitic capacitance CP1 exists among the word lines WLo1, WLo2, WLn−1, WLn, and WLn+1, and parasitic capacitance CP2 exists among the word lines WLo1, WLo2, WLn−1, WLn, and WLn+1 and a bit line BLx. As such, when the voltages on the word lines WLo1, WLo2, WLn−1, WLn, and WLn+1 and a voltage on the bit line BLx change, changes of the voltage on the program bit line WLn is interfered owing to the coupling effect brought by the parasitic capacitance CP1 and the parasitic capacitance CP2. Nevertheless, through the method provided by the foregoing embodiments of the invention, influences generated by the parasitic capacitance CP1 and the parasitic capacitance CP2 are overcome and execution of programming may be accelerated.

In view of the foregoing, in the invention, when the voltage on the program word line is raised from the first program voltage to the second program voltage, the voltages on the unselected word lines are synchronously raised to the pass voltage. In this way, the parasitic effect generated by the parasitic capacitance among the program word line and the unselected word lines may be effectively reduced, and programming of the non-volatile memory cell is therefore accelerated.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A program method of a non-volatile memory, comprising:
   setting one of a plurality of word lines to be a program word line, setting the word lines except the program word line to be a plurality of unselected word lines;
   raising a voltage on the program word line from a reference voltage to a first program voltage during a first sub-time period of a program time period;
   raising the voltage on the program word line from the first program voltage to a second program voltage during a second sub-time period of the program time period, wherein the second program voltage is greater than the first program voltage; and
   raising voltages on at least part of the unselected word lines from the reference voltage to a pass voltage during the second sub-time period,
   wherein the first sub-time period is before the second sub-time period.

2. The program method as claimed in claim 1, wherein steps of raising the voltage on the program word line from the first program voltage to the second program voltage and raising the voltages on at least part of the unselected word lines from the reference voltage to the pass voltage comprise:
   synchronizing the movement of raising the voltage on the program word line from the first program voltage to the second program voltage with the movement of raising the voltages on at least part of the unselected word lines from the reference voltage to the pass voltage.

3. The program method as claimed in claim 1, wherein a step of raising the voltages on at least part of the unselected word lines from the reference voltage to the pass voltage during the second sub-time period comprises:
   raising voltages of a plurality of adjacent unselected word lines adjacent to the program word line among the unselected word lines from the reference voltage to the pass voltage during the second sub-time period.

4. The program method as claimed in claim 3, wherein the program method further comprises:
   raising voltages of a plurality of other unselected word lines not being adjacent to the program word line among the unselected word lines from the reference voltage to the pass voltage during the first sub-time period.

5. The program method as claimed in claim 1, wherein a step of raising the voltages on at least part of the unselected word lines from the reference voltage to the pass voltage during the second sub-time period comprises:
   raising voltages of a plurality of other unselected word lines not being adjacent to the program word line among the unselected word lines from the reference voltage to the pass voltage during the second sub-time period.

6. The program method as claimed in claim 5, wherein the program method further comprises:
   raising voltages of a plurality of adjacent unselected word lines adjacent to the program word line among the unselected word lines from the reference voltage to the pass voltage during the first sub-time period.

7. The program method as claimed in claim 1, further comprising:
   raising voltages on a plurality of source lines corresponding to the word lines and a voltage on a bit line from the reference voltage to a pre-charge voltage during a pre-charge time period before the program time period.

8. The program method as claimed in claim 7, further comprising:
   maintaining voltages on a plurality of mask bit lines corresponding to a plurality of masked memory cells to be equal to the pre-charge voltage and pulling down voltages on a plurality of program bit lines corresponding to a plurality of programmed memory cells from the pre-charge voltage to the reference voltage before the second sub-time period of the program time period.

9. The program method as claimed in claim 8, further comprising:
   pulling down voltages on a plurality of unselected source lines corresponding to the unselected word lines from the pre-charge voltage to the reference voltage before the voltages on the program bit lines are pulled down to the reference voltage during the first sub-time period of the program time period; and
   maintaining voltages on a plurality of selected source lines corresponding to the program word lines to be equal to the pre-charge voltage during the program time period.

10. The program method as claimed in claim 1, wherein the non-volatile memory is a two-dimensionally structured flash memory or a three-dimensionally structured flash memory.

11. A non-volatile memory, comprising:
    a plurality of word lines, each of the word lines coupled to at least one memory cell string;

a plurality of word line drivers, coupled to the word lines, configured to adjust voltages on the word lines; and a controller, coupled to the word line drivers, configured to:
- set one of the word lines to be a program word line, set the word lines except the program word line to be a plurality of unselected word lines;
- raise a voltage on the program word line from a reference voltage to a first program voltage during a first sub-time period of a program time period;
- raise the voltage on the program word line from the first program voltage to a second program voltage during a second sub-time period of the program time period, wherein the second program voltage is greater than the first program voltage; and
- raise voltages on at least part of the unselected word lines from the reference voltage to a pass voltage during the second sub-time period,
- wherein the first sub-time period is before the second sub-time period.

12. The non-volatile memory as claimed in claim 11, wherein the controller is further configured to:
- synchronize the movement of raising the voltage on the program word line from the first program voltage to the second program voltage with the movement of raising the voltages on at least part of the unselected word lines from the reference voltage to the pass voltage.

13. The non-volatile memory as claimed in claim 11, wherein the controller is further configured to:
- raise voltages of a plurality of adjacent unselected word lines adjacent to the program word line among the unselected word lines from the reference voltage to the pass voltage during the second sub-time period.

14. The non-volatile memory as claimed in claim 13, wherein the controller is further configured to:
- raise voltages of a plurality of other unselected word lines not being adjacent to the program word line among the unselected word lines from the reference voltage to the pass voltage during the first sub-time period.

15. The non-volatile memory as claimed in claim 11, wherein the controller is further configured to:
- raise voltages of a plurality of other unselected word lines not being adjacent to the program word line among the unselected word lines from the reference voltage to the pass voltage during the second sub-time period.

16. The non-volatile memory as claimed in claim 15, wherein the controller is further configured to:
- raise voltages of a plurality of adjacent unselected word lines adjacent to the program word line among the unselected word lines from the reference voltage to the pass voltage during the first sub-time period.

17. The non-volatile memory as claimed in claim 11, wherein the controller is further configured to:
- raise voltages on a plurality of source lines corresponding to the word lines and a voltage on a bit line from the reference voltage to a pre-charge voltage during a pre-charge time period before the program time period; and
- maintain voltages on a plurality of mask bit lines corresponding to a plurality of masked memory cells to be equal to the pre-charge voltage and pull down voltages on a plurality of program bit lines corresponding to a plurality of programmed memory cells from the pre-charge voltage to the reference voltage before the second sub-time period of the program time period.

18. The non-volatile memory as claimed in claim 17, wherein the controller is further configured to:
- pull down voltages on a plurality of unselected source lines corresponding to the unselected word lines from the pre-charge voltage to the reference voltage before the voltages on the program bit lines are pulled down to the reference voltage during the first sub-time period of the program time period.

19. The non-volatile memory as claimed in claim 17, wherein the controller is further configured to:
- maintain voltages on a plurality of selected source lines corresponding to the program word lines to be equal to the pre-charge voltage during the program time period.

20. The non-volatile memory as claimed in claim 11, wherein the non-volatile memory is a two-dimensionally structured flash memory or a three-dimensionally structured flash memory.

* * * * *